US010804009B2

(12) United States Patent
Yanagawa et al.

(10) Patent No.: US 10,804,009 B2
(45) Date of Patent: Oct. 13, 2020

(54) TWINAX CABLE AND MULTI-CORE CABLE

(71) Applicant: SUMITOMO ELECTRIC INDUSTRIES, LTD., Osaka-shi, Osaka (JP)

(72) Inventors: Nayu Yanagawa, Osaka (JP); Shinya Nishikawa, Osaka (JP); Taro Fujita, Osaka (JP); Yuto Kobayashi, Kanuma (JP); Masaki Hayakawa, Kanuma (JP); Atsushi Tsujino, Kanuma (JP); Yuji Ochi, Kanuma (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 16/321,530

(22) PCT Filed: Jun. 20, 2018

(86) PCT No.: PCT/JP2018/023466
§ 371 (c)(1),
(2) Date: Jan. 29, 2019

(87) PCT Pub. No.: WO2019/082437
PCT Pub. Date: May 2, 2019

(65) Prior Publication Data

US 2019/0172610 A1 Jun. 6, 2019

(30) Foreign Application Priority Data

Oct. 25, 2017 (JP) ................................ 2017-206550

(51) Int. Cl.
*H01B 11/06* (2006.01)
*H01B 7/08* (2006.01)
(Continued)

(52) U.S. Cl.
CPC ............... *H01B 11/06* (2013.01); *H01B 3/44* (2013.01); *H01B 7/02* (2013.01); *H01B 7/0807* (2013.01); *H01B 11/20* (2013.01)

(58) Field of Classification Search
CPC . H01B 11/06; H01B 3/44; H01B 7/02; H01B 7/0807
See application file for complete search history.

(56) References Cited

U.S. PATENT DOCUMENTS 5,283,390 A * 2/1994 Hubis .................... H01B 11/10 156/51
5,334,271 A * 8/1994 Bullock .................. B29C 65/48 156/244.12
(Continued)

FOREIGN PATENT DOCUMENTS

JP 06234889 A * 8/1994
JP H06-234889 A 8/1994
(Continued)

*Primary Examiner* — William H. Mayo, III
*Assistant Examiner* — Rhadames Alonzo Miller
(74) *Attorney, Agent, or Firm* — Faegre Drinker Biddle & Reath LLP

(57) ABSTRACT

A twinax cable 100 includes a twinax structure, the twinax structure including: a signal wire pair, the signal wire pair including a pair of signal wires formed of a first signal wire and a second signal wire, and an insulating layer configured to cover the pair of signal wires; a drain wire; and a shield tape arranged on the outer circumferential side of the insulating layer to cover the signal wire pair and the drain wire. The insulating layer is mainly composed of polyethylene. The insulating layer includes not less than 30 ppm and not more than 4000 ppm of a hindered phenol-based antioxidant. A dielectric tangent tan δ of the insulating layer at the time of application of a high-frequency electric field having a frequency of 10 GHz is not more than $3.0\times10^{-4}$.

7 Claims, 2 Drawing Sheets

(51) Int. Cl.

| | |
|---|---|
| ***H01B 7/02*** | (2006.01) |
| ***H01B 3/44*** | (2006.01) |
| ***H01B 11/20*** | (2006.01) |

(56) References Cited

U.S. PATENT DOCUMENTS

| | | | | |
|---|---|---|---|---|
| 6,403,887 | B1 * | 6/2002 | Kebabjian | H01B 11/002 174/110 R |
| 9,123,457 | B2 * | 9/2015 | Kaga | H01B 13/06 |
| 9,142,333 | B2 * | 9/2015 | Kaga | H01B 13/142 |
| 9,583,235 | B2 * | 2/2017 | Nonen | H01B 11/085 |
| 2011/0083877 | A1 * | 4/2011 | Sugiyama | H01B 7/0823 174/115 |
| 2011/0100682 | A1 * | 5/2011 | Nonen | H01B 11/203 174/254 |
| 2011/0232941 | A1 * | 9/2011 | Sugiyama | H01B 11/203 174/250 |
| 2012/0152589 | A1 * | 6/2012 | Kumakura | H01B 11/183 174/109 |
| 2013/0087361 | A1 * | 4/2013 | Kaga | H01B 3/441 174/102 R |
| 2013/0264091 | A1 * | 10/2013 | Watanabe | H01B 3/441 174/110 SR |
| 2015/0056434 | A1 * | 2/2015 | Kawasaki | H05K 1/0366 428/221 |

FOREIGN PATENT DOCUMENTS

| | | | | | |
|---|---|---|---|---|---|
| JP | 2004-87189 | A | | 3/2004 | |
| JP | 2012-87185 | A | | 5/2012 | |
| JP | 2012087185 | A | * | 5/2012 | |
| WO | WO-2011/048973 | A1 | | 4/2011 | |
| WO | WO-2011048973 | A1 | * | 4/2011 | H01B 13/142 |

* cited by examiner

TWINAX CABLE AND MULTI-CORE CABLE

TECHNICAL FIELD

The present disclosure relates to a twinax cable and a multi-core cable. The present application claims the priority based on Japanese Patent Application No. 2017-206550 filed on Oct. 25, 2017, the entire contents of which are hereby incorporated by reference.

BACKGROUND ART

A technique of signal transmission by differential transmission is known as a technique for transmitting a signal at high speed. The differential transmission is a method for passing signals having opposite phases through a pair of signal wires and transmitting the signals by a potential difference between the signal wires. One example of a twinax cable that is applicable to communication by the differential transmission is disclosed in Patent Literature 1.

CITATION LIST

Patent Literature

PTL 1: Japanese Patent Laying-Open No. 2004-87189

SUMMARY OF INVENTION

A twinax cable of the present disclosure includes a twinax structure, the twinax structure including: a signal wire pair, the signal wire pair including a pair of signal wires formed of a first signal wire and a second signal wire, and an insulating layer configured to cover the pair of signal wires; a drain wire; and a shield tape arranged to cover the signal wire pair and the drain wire. The insulating layer is mainly composed of a polyolefin resin. The insulating layer includes not less than 30 ppm and not more than 4000 ppm of a hindered phenol-based antioxidant. A dielectric tangent tan δ of the insulating layer at the time of application of a high-frequency electric field having a frequency of 10 GHz is not more than $3.0\times10^{-4}$.

DETAILED DESCRIPTION

Figure 1:
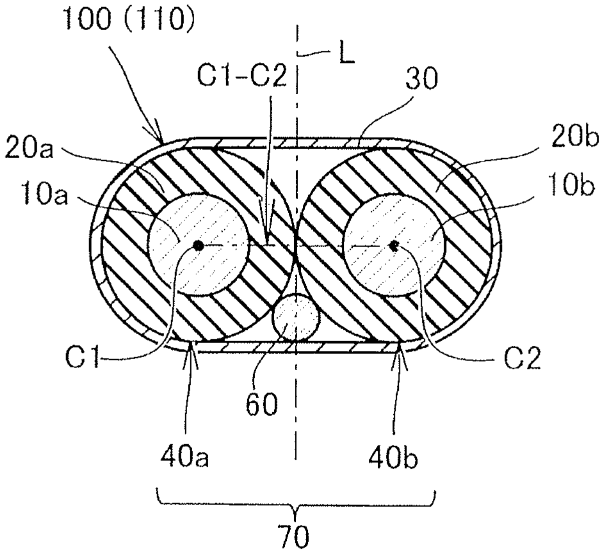
FIG. 1 is a schematic cross-sectional view illustrating one example of a twinax cable.

Problem to be Solved by the Present Disclosure

With an increase in amount of data transmitted through a cable, further speed-up of signal transmission is also demanded in communication by the differential transmission. A transmission loss has the positive correlation with a frequency of a signal and a dielectric tangent of an insulating layer of a signal transmission cable. Therefore, in order to speed up signal transmission, it is necessary to reduce the dielectric tangent of the insulating layer in a high-frequency band and further reduce the transmission loss to thereby perform stable signal transmission. In addition, in order to improve the quality of the signal in the differential transmission, it is important to reduce a difference in propagation delay times (skew) between two signal wires. One object of the present disclosure is to provide a twinax cable in which a signal transmission loss can be sufficiently reduced and a skew can be sufficiently reduced.

Advantageous Effect of the Present Disclosure

According to the above-described twinax cable, there can be provided a twinax cable in which a signal transmission loss and a skew can be sufficiently reduced.

DESCRIPTION OF EMBODIMENTS

First, embodiments of the present disclosure will be listed and described. A twinax cable of the present disclosure includes a twinax structure, the twinax structure including: a signal wire pair, the signal wire pair including a pair of signal wires formed of a first signal wire and a second signal wire, and an insulating layer configured to cover the pair of signal wires; a drain wire; and a shield tape arranged to cover the signal wire pair and the drain wire. The insulating layer is mainly composed of a polyolefin resin. The insulating layer includes not less than 30 ppm and not more than 4000 ppm of a hindered phenol-based antioxidant. A dielectric tangent tan δ of the insulating layer at the time of application of a high-frequency electric field having a frequency of 10 GHz is not more than $3.0\times10^{-4}$.

The twinax cable of the present disclosure includes a twinax structure, the twinax structure including: a signal wire pair including a pair of signal wires formed of a first signal wire and a second signal wire, and an insulating layer configured to cover the pair of signal wires; a drain wire; and a shield tape arranged to cover the signal wire pair and the drain wire. The twinax cable of the present disclosure has such a twinax structure, and thus, the twinax cable of the present disclosure can more efficiently perform signal transmission with a high degree of accuracy and at high speed. In addition, the drain wire is grounded, and thus, charging in the twinax cable can be prevented. Furthermore, the twinax cable of the present disclosure includes the shield tape, and thus, electromagnetic noise interference from outside can be prevented and mutual interference between the signal wires of the signal wire pair can be reduced.

In order to transmit a signal at high speed and stably speed up signal transmission in a high-frequency band in the twinax cable, it is necessary to perform stable signal transmission in the high-frequency band. As the frequency becomes higher, further reduction in transmission loss is demanded.

In order to reduce the transmission loss of the twinax cable, it is important to select an appropriate material. The present inventors studied an appropriate material to achieve the above-described object, and obtained the following findings. First, a polyolefin resin is used as a main component of the insulating layer forming the signal pair. The polyolefin resin is a material suitable for achieving a low transmission loss. In addition, the polyolefin resin is also excellent in molding workability and particularly extrusion moldability.

Furthermore, an insulating layer that is mainly composed of a polyolefin resin and includes not less than 30 ppm and not more than 4000 ppm of a hindered phenol-based antioxidant is used as the above-described insulating layer. Although the polyolefin resin is a suitable component as the main component of the insulating layer, the polyolefin resin as it is tends to increase the transmission loss of the twinax cable due to deterioration caused by oxidation of the insulating layer. The insulating layer includes the hindered phenol-based antioxidant, which makes it possible to prevent deterioration caused by oxidation of the insulating layer and suppress an increase in transmission loss. However, when the hindered phenol-based antioxidant is added, a content thereof is important. If the content of the hindered phenol-based antioxidant is too high, the transmission loss increases and the skew also increases. On the other hand, if the content of the hindered phenol-based antioxidant is too low, the transmission loss increases due to an influence of deterioration caused by oxidation. Specifically, if the content of the hindered phenol-based antioxidant exceeds 4000 ppm, an increase in transmission loss and skew becomes pronounced. If the content is less than 30 ppm, the effect of suppressing deterioration caused by oxidation is insufficient. Therefore, it is necessary to set the content of the hindered phenol-based antioxidant to be not less than 30 ppm and not more than 4000 ppm.

Furthermore, according to the study by the present inventors, even when the covering layer includes the above-described component, the transmission loss cannot be sufficiently reduced if dielectric tangent tan δ is too great. Specifically, in the twinax cable of the present disclosure, if dielectric tangent tan δ of the insulating layer at the time of application of a high-frequency electric field having a frequency of 10 GHz exceeds $3.0\times10^{-4}$, the signal transmission loss of the twinax cable is not sufficiently reduced. The twinax cable of the present disclosure includes the insulating layer whose dielectric tangent tan δ at the time of application of a high-frequency electric field having a frequency of 10 GHz is not more than $3.0\times10^{-4}$, which makes it possible to sufficiently reduce the signal transmission loss of the twinax cable.

That is, in the twinax cable of the present disclosure including the above-described twinax structure, the insulating layer is mainly composed of a polyolefin resin and includes not less than 30 ppm and not more than 4000 ppm of a hindered phenol-based antioxidant and dielectric tangent tan δ of the insulating layer at the time of application of a high-frequency electric field having a frequency of 10 GHz is not more than $3.0\times10^{-4}$. Therefore, there can be provided a twinax cable in which a signal transmission loss can be sufficiently reduced and a skew can be reduced.

In the above-described twinax cable, a skew (propagation delay time difference between the two signal wires of the signal wire pair) may be not more than 6 ps/m. When the skew is within such a range, signal transmission with sufficiently high reliability can be achieved.

A molecular weight distribution Mw/Mn of the above-described polyolefin resin is preferably not less than 6.0. In order to reduce the occurrence of the above-described skew, it is important not only to enhance the shape retaining property of the completed cable, but also to form a twinax cable having a shape that is as highly symmetric as possible during formation of the cable. In the case of a cable including a pair of conductors, when the symmetry of the cable is lost, a gap occurs between travel path lengths of two signals. As a result, the skew occurs between the two signals, which causes a decrease in accuracy of communication. In order to stably form a highly symmetric insulating layer, it is important to select a material having high shape retaining property and high molding workability as a material for the insulating layer. Since it is advantageous in production efficiency to form the insulating layer of the above-described twinax cable by extrusion molding, high extrusion moldability, among molding workability, is particularly demanded.

The polyolefin resin itself is a material excellent in shape retaining property. In addition, when molecular weight distribution Mw/Mn of the above-described polyolefin resin is not less than 6.0, it is easy to obtain a twinax cable excellent in workability during extrusion molding, highly symmetric, and suited for signal transmission with a high degree of accuracy.

The above-described polyolefin resin may be any one of low density polyethylene, linear low density polyethylene, medium density polyethylene, and high density polyethylene. As the polyolefin resin, these resins are excellent in workability during extrusion molding. Therefore, it is easier to obtain a twinax cable highly symmetric and suited for signal transmission with a high degree of accuracy.

The above-described polyolefin resin may be electron-beam-crosslinked. The insulating layer including the electron-beam-crosslinked polyolefin resin is more excellent in shape retaining property particularly at high temperature, as compared with an insulating layer including a polyolefin resin that is not electron-beam-crosslinked. Therefore, the insulating layer including the electron-beam-crosslinked polyolefin resin can retain the shape even when the insulating layer is exposed to high temperature (150° C. to 200° C.) during extrusion covering of a sheath. As a result, the occurrence of the skew can be further reduced and the stability of the signal transmission accuracy of the cable can be further increased.

In the above-described twinax cable, a cross section perpendicular to a longitudinal direction of the twinax cable may be symmetric with respect to a perpendicular bisector line of a line segment connecting a center of gravity C1 of the first signal wire and a center of gravity C2 of the second signal wire. The twinax cable having such a shape is suitable for signal transmission with a high degree of accuracy and at high speed.

A multi-core cable of the present disclosure includes at least one twinax cable described above, and a hollow cylindrical sheath arranged to contain the twinax cable. In order to achieve signal transmission with a high degree of accuracy, it is necessary to suppress deformation of the twinax cable as much as possible. When the twinax cable deforms, the skew increases. The multi-core cable of the present disclosure further includes the sheath, which makes it possible to enhance the shape retaining property of the twinax cable, and as a result, further reduce the occurrence of the skew.

[Details of Embodiments]

Next, one embodiment of the twinax cable and the multi-core cable of the present disclosure will be described with reference to the drawings. In the following drawings, the same or corresponding portions are denoted by the same reference numerals and description thereof will not be repeated.

(First Embodiment)

[Configuration of Twinax Cable]

First, a first embodiment will be described with reference to FIG. 1. FIG. 1 is a schematic cross-sectional view illustrating one example of a twinax cable. A twinax cable 100 illustrated in FIG. 1 includes a twinax structure 110 having two signal wires per one cable. Referring to FIG. 1, twinax structure 110 includes a signal wire pair 70 formed of a first conductor 10*a* serving as a first signal wire and a second conductor 10*b* serving as a second signal wire. Twinax structure 110 further includes a first insulating layer

20*a*, a second insulating layer 20*b*, a third conductor 60 serving as a drain wire, and a shield tape 30.

[First Signal Wire, Second Signal Wire and Drain Wire]

Each of first conductor 10*a* serving as a first signal wire, second conductor 10*b* serving as a second signal wire, and third conductor 60 serving as a drain wire has a linear shape. Each of conductors 10*a*, 10*b* and 60 is made of metal having a high conductivity and a high mechanical strength. Examples of such metal include copper, copper alloy, aluminum, aluminum alloy, nickel, silver, soft iron, steel, stainless steel and the like. A material obtained by molding these metals into a linear shape, or a multi-layered material obtained by further cladding such a linear material with another metal, such as, for example, a nickel-clad copper wire, a silver-clad copper wire, a copper-clad aluminum wire, or a copper-clad steel wire, can be used as first conductor 10*a*, second conductor 10*b* and third conductor 60 described above.

[Insulating Layer]

Twinax structure 110 of twinax cable 100 according to the first embodiment includes two insulating layers 20*a* and 20*b* as the insulating layers. First insulating layer 20*a* is arranged to cover the outer circumferential side of first conductor 10*a* serving as a first signal wire. Second insulating layer 20*b* is arranged to cover the outer circumferential side of second conductor 10*b* serving as a second signal wire.

Each of first insulating layer 20*a* and second insulating layer 20*b* is mainly composed of a polyolefin resin. "Mainly composed" means that a ratio of the polyolefin resin to the constituent components forming each of first insulating layer 20*a* and second insulating layer 20*b* is not less than 50 mass %. A ratio of polyethylene to the constituent components forming each of first insulating layer 20*a* and second insulating layer 20*b* is preferably not less than 90 mass %, more preferably not less than 95 mass %, and particularly preferably not less than 99 mass %.

Examples of the polyolefin resin include low density polyethylene (LDPE), linear low density polyethylene (LLDPE), very low density polyethylene (VLDPE), high density polyethylene (HDPE), polypropylene homopolymer, polypropylene random polymer, polypropylene copolymer, poly (4-methylpentene-1), cyclic olefin polymer, cyclic olefin copolymer and the like. Among these, at least one selected from LDPE and LLDPE is preferable. Each of insulating layers 20*a* and 20*b* may include either LDPE or LLDPE, or may include both LDPE and LLDPE. A total ratio of LDPE and LLDPE to the total polyethylene component forming each of insulating layers 20*a* and 20*b* is preferably not less than 90 mass %, more preferably not less than 95 mass %, and particularly preferably not less than 99 mass %.

Molecular weight distribution Mw/Mn of the polyolefin resin is preferably not less than 6.0. When molecular weight distribution Mw/Mn is not less than 6.0, the workability during extrusion molding is excellent. Therefore, it is easy to obtain a twinax cable having a highly symmetric shape and suited for signal transmission with a high degree of accuracy.

The polyolefin resin forming each of insulating layers 20*a* and 20*b* may be electron-beam-crosslinked. Electron-beam-crosslinking provides the enhanced shape retaining property of twinax cable 100. As a result, the stability of the signal transmission accuracy of twinax cable 100 can be further increased.

Together with the above-described polyolefin resin, each of insulating layers 20*a* and 20*b* includes not less than 30 ppm and not more than 4000 ppm of a hindered phenol-based antioxidant. The hindered phenol-based antioxidant is an antioxidant having a hindered phenol structure in which both of the ortho positions of the OH group of phenol are substituted by bulky substituents. The above-described bulky substituent is not particularly limited, and examples thereof include a tertiary alkyl group such as a t-butyl group, a secondary alkyl group such as a sec-butyl group, a branched alkyl group such as an isobutyl group or an isopentyl group, and the like.

Examples of the hindered phenol-based antioxidant include an antioxidant having a chemical structure represented by the following formula (1):

[Chemical formula 1]

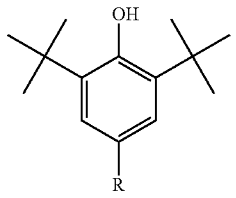

(wherein R represents a monovalent organic group).

Although not particularly limited, specific examples of the hindered phenol-based antioxidant include Irganox® 1010 represented by the following formula (2):

[Chemical formula 2]

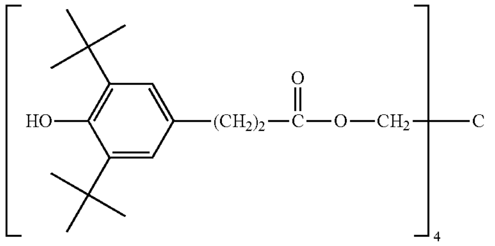

Irganox® 1076 represented by the following formula (3):

[Chemical formula 3]

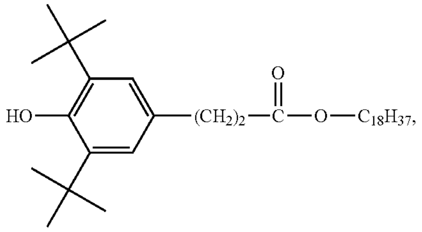

Each of first insulating layer 20*a* and second insulating layer 20*b* may include only one type of these hindered phenol-based antioxidants, or may include two or more types of these hindered phenol-based antioxidants.

A content of the hindered phenol-based antioxidant in each of first insulating layer 20*a* and second insulating layer 20*b* is not less than 30 ppm and not more than 4000 ppm. The upper limit is preferably 500 ppm, more preferably 200 ppm, and further preferably 100 ppm. The lower limit is more preferably 40 ppm. If the content of the hindered phenol-based antioxidant is too high, the transmission loss increases and the skew also increases. On the other hand, if the content of the hindered phenol-based antioxidant is too low, the transmission loss again increases due to an influence of deterioration caused by oxidation. The content of the hindered phenol-based antioxidant in each of first insulating layer 20*a* and second insulating layer 20*b* is not less than 30 ppm and not more than 4000 ppm, which makes it possible to obtain twinax cable 100 that can achieve a low transmission loss and a low skew. When each of first insulating layer 20*a* and second insulating layer 20*b* includes two or more types of hindered phenol-based antioxidants, the above-described content of the hindered phenol-based antioxidant means a total content of all of the hindered phenol-based antioxidants in each of first insulating layer 20*a* and second insulating layer 20*b*.

Dielectric tangent tan δ of each of first insulating layer 20*a* and second insulating layer 20*b* at the time of application of a high-frequency electric field having a frequency of 10 GHz is not more than $3.0\times10^{-4}$. Dielectric tangent tan δ is preferably not more than $2.5\times10^{-4}$, and more preferably not more than $2.0\times10^{-4}$. The dielectric tangent is an indicator of the magnitude of an electric energy loss in a material.

As one example, the dielectric tangent at 10 GHz can be measured as follows. In accordance with JIS R 1641 (2007), a value of the dielectric tangent (tan δ) measured at the measurement frequency of 10 GHz is obtained for a polyolefin resin molded into a sheet having a diameter φ of 180 mm and a thickness of 1 mm. Based on the obtained value, the dielectric characteristic at the frequency of 10 GHz can be evaluated. Twinax cable 100 has insulating layers 20*a* and 20*b*, each of which is made of a material whose dielectric tangent tan δ at the time of application of a high-frequency electric field having a frequency of 10 GHz is not more than $3.0\times10^{-4}$, and thus, twinax cable 100 can be suitable as a cable for high-speed communication.

Each of first insulating layer 20*a* and second insulating layer 20*b* according to the present embodiment may include another additional component other than the above-described components as needed. For example, each of first insulating layer 20*a* and second insulating layer 20*b* according to the present embodiment may include an appropriate amount of an inorganic filler (such as talc), an antioxidant (such as a sulfur-based antioxidant, a phosphorus-based antioxidant, an amine-based antioxidant, or a hindered amine light stabilizer (HALS)) other than the hindered phenol-based antioxidant, a lubricant (such as a fatty acid, a fatty acid metal salt or fatty acid ester), carbon black, or the like. Each of first insulating layer 20*a* and second insulating layer 20*b* according to the present embodiment may include a pigment or a dye for coloring. However, dielectric tangent tan δ may in some cases exceed $3.0\times10^{-4}$, depending on the type and the amount of the additive. Therefore, when each of first insulating layer 20*a* and second insulating layer 20*b* includes the additive, the additive is used within a range that satisfies the condition that dielectric tangent tan δ at the time of application of a high-frequency electric field having a frequency of 10 GHz is not more than $3.0\times10^{-4}$.

[Shield Tape]

In the present embodiment, twinax structure 110 of twinax cable 100 includes shield tape 30 arranged to cover signal wire pair 70 and third conductor 60 serving as a drain wire. Shield tape 30 is formed by providing an electrically-conductive layer on one surface of an insulating film made of a resin such as a polyvinyl chloride resin or a flame-retardant polyolefin resin. Twinax structure 110 of twinax cable 100 includes shield tape 30, which makes it possible to prevent electromagnetic noise interference from outside and reduce mutual interference between the signal wires of the signal wire pair. In the present embodiment, shield tape 30 is arranged to cover the outer circumferential side of insulating layers 20*a* and 20*b*.

[Overall Structure of Twinax Cable 100]

Twinax cable 100 includes: signal wire pair 70 formed of a first electric wire 40*a* including first conductor 10*a* and first insulating layer 20*a* and a second electric wire 40*b* including second conductor 10*b* and second insulating layer 20*b*; third conductor 60 serving as a drain wire; and shield tape 30. Second conductor 10*b* is arranged to be separated from first conductor 10*a* and extend along a longitudinal direction of first conductor 10*a*. First insulating layer 20*a* is arranged to cover the outer circumferential side of first conductor 10*a*. Second insulating layer 20*b* is arranged to cover the outer circumferential side of second conductor 10*b*. Shield tape 30 is arranged on the outer circumferential side of first insulating layer 20*a* and second insulating layer 20*b* to relatively fix the positional relation between first electric wire 40*a* and second electric wire 40*b* while wrapping first electric wire 40*a*, second electric wire 40*b* and third conductor 60.

Referring to FIG. 1, in twinax cable 100, a cross section perpendicular to the longitudinal direction of twinax cable 100 is symmetric with respect to a perpendicular bisector line L of a line segment C1 to C2 connecting a center of gravity C1 of first conductor 10*a* serving as a first signal wire and a center of gravity C2 of second conductor 10*b* serving as a second signal wire. When twinax cable 100 has such high symmetry, the skew does not easily occur between two signals flowing through first conductor 10*a* and second conductor 10*b*. Therefore, when the two signals are transmitted through first conductor 10*a* and second conductor 10*b*, signal transmission can be performed with the sufficiently suppressed skew. As a result, signal transmission with a high degree of accuracy is achieved. Such twinax cable 100 having twinax structure 110 is suitably used as a twinax cable configured to transmit a differential signal, in the field that requires high-speed communication.

[Method for Manufacturing Twinax Cable 100]

Twinax cable 100 having twinax structure 110 is formed as follows, for example. First, linear first conductor 10*a* and linear second conductor 10*b* are prepared. Such linear conductors 10*a* and 10*b* are prepared by stretching a wire made of copper or copper alloy to have a desired diameter, a desired shape and desired properties (such as stiffness).

A resin composition for forming first insulating layer 20*a* and second insulating layer 20*b* is separately prepared by kneading the polyolefin resin, the hindered phenol-based antioxidant and any other necessary component. The additive may be added as needed. However, the blend is adjusted such that dielectric tangent tan δ of first insulating layer 20*a* and second insulating layer 20*b* at the time of application of a high-frequency electric field having a frequency of 10 GHz is not more than $3.0\times10^{-4}$.

The outer circumferential side of first conductor 10*a* is covered with the prepared resin composition, to thereby form first insulating layer 20*a*. Similarly, the outer circumferential side of second conductor 10*b* is covered with the resin composition, to thereby form second insulating layer 20*b*. The cover on the outer circumferential side of first conductor 10*a* or second conductor 10*b* can be formed by using, for example, an extruder to extrude the resin composition so as to cover the outer circumference of first conductor 10*a* or second conductor 10*b* while conveying first conductor 10*a* or second conductor 10*b*. Thus, first electric wire 40*a* and second electric wire 40*b* are formed. First electric wire 40*a* and second electric wire 40*b* are bundled together, and third conductor 60 serving as a drain wire is arranged, and shield tape 30 is wound around the outer circumference thereof. Thus, twinax cable 100 having twinax structure 110 can be obtained. A tape-like member such as a copper-deposited PET tape can, for example, be used as shield tape 30. As described above, twinax cable 100 having twinax structure 110 is manufactured.

[Second Embodiment]

Figure 2:
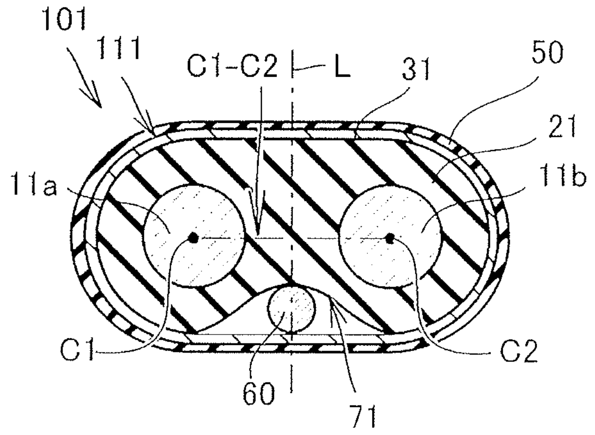
FIG. 2 is a schematic cross-sectional view illustrating one example of a twinax cable.

Next, a second embodiment will be described with reference to FIG. 2. FIG. 2 is a schematic cross-sectional view illustrating another example of the twinax cable. The second embodiment is different from the first embodiment in that an insulating layer 21 is integrally formed to cover the outer circumferential side of both a first conductor 11*a* and a second conductor 11*b*, and in that a sheath 50 is provided as a surface layer.

Referring to FIG. 2, a twinax cable 101 includes: a twinax structure 111 formed of linear first conductor 11*a*, linear second conductor 11*b*, insulating layer 21, third conductor 60 serving as a drain wire, and a shield tape 31, and sheath 50. Second conductor 11*b* is arranged to be separated from first conductor 11*a* and extend along a longitudinal direction of first conductor 11*a*. In twinax cable 101 according to the second embodiment, insulating layer 21 is integrally molded and arranged to cover the outer circumferential side of each of first conductor 11*a* and second conductor 11*b*. First conductor 11*a*, second conductor 11*b* and insulating layer 21 form a signal wire pair 71. Shield tape 31 is arranged to cover signal wire pair 71 and third conductor 60 serving as a drain wire.

Sheath 50 is arranged to cover the outer circumferential side of shield tape 31. Since twinax cable 101 has sheath 50, twinax structure 111 is protected without being exposed to the external environment. Since twinax cable 101 has sheath 50 as described above, the durability, the weather resistance, the flame retardancy and the like of twinax cable 101 are increased. Furthermore, since twinax cable 101 has sheath 50, the shape retaining property in twinax structure 111 is enhanced. Therefore, it is preferable that twinax cable 101 includes sheath 50. Shield tape 30 may be made of a resin such as a polyvinyl chloride resin or a flame-retardant polyolefin resin.

In addition, first conductor 11*a* and second conductor 11*b* are made of a material similar in raw material and shape to first conductor 10*a* and second conductor 10*b* in the first embodiment. Insulating layer 21 is composed of the components (polyethylene and the hindered phenol-based antioxidant) similar to those of first insulating layer 20*a* or second insulating layer 20*b* in the first embodiment. Dielectric tangent tan δ of insulating layer 21 at the time of application of a high-frequency electric field having a frequency of 10 GHz is not more than $2.8\times10^{-4}$. In addition, shield tape 31 is made of a material similar to that of shield tape 30 in the first embodiment.

Referring to FIG. 2, in twinax cable 101, a cross section perpendicular to the longitudinal direction of twinax cable 101 is symmetric with respect to a perpendicular bisector line L of a line segment C1 to C2 connecting a center of gravity C1 of first conductor 11*a* and a center of gravity C2 of second conductor 11*b*. Since twinax cable 101 has such high symmetry, signal transmission with a high degree of accuracy is achieved. Such twinax cable 101 is suitably used as a twinax cable configured to transmit a differential signal, in the field that requires high-speed communication.

Insulating layer 21 can be formed to cover the outer circumferential side of both of first conductor 11*a* and second conductor 11*b*, for example, by performing extrusion-molding of a resin composition for forming insulating layer 21, while conveying first conductor 11*a* and second conductor 11*b*, with first conductor 11*a* and second conductor 11*b* arranged in parallel.

[Multi-Core Cable]

Figure 3:
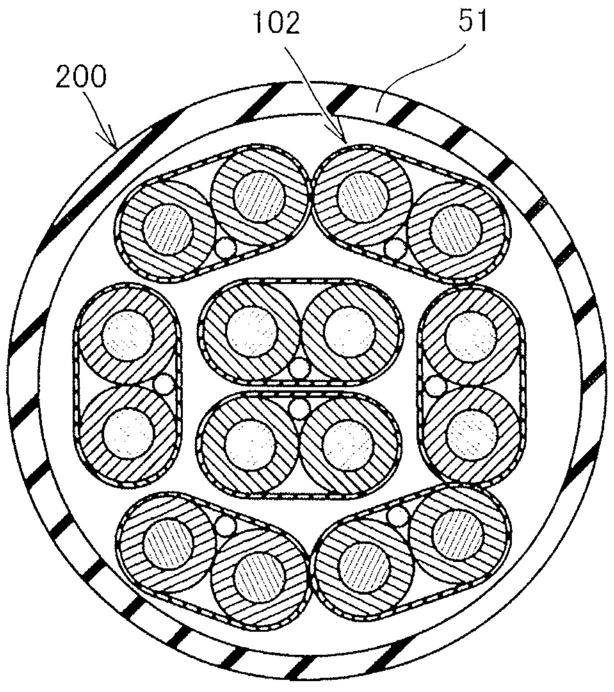
FIG. 3 is a schematic cross-sectional view illustrating one example of a multi-core cable.

Next, an embodiment of a multi-core cable, which is another embodiment of the present disclosure, will be described. FIG. 3 is a schematic cross-sectional view illustrating one example of a multi-core cable. Referring to FIG. 3, in a multi-core cable 200, a plurality of sub-units 102 each corresponding to twinax cable 100 in the first embodiment are further covered with sheath 50. A structure of each sub-unit 102 of the twinax cable is the same as that of twinax cable 100 in the first embodiment. Multi-core cable 200 illustrated in FIG. 3 can transmit a larger-capacity signal, as compared with twinax cables 100 and 101.

EXAMPLES

Next, the following experiment was performed to check the effect of the invention, and the properties were evaluated. The result is illustrated in Tables 1 and 2. Experimental Examples 1 to 5 are examples, and Experimental Examples 6 and 7 are comparative examples.

(Properties of Resin Compositions for Forming Insulating Layers)

Resin compositions for forming insulating layers that had the blending components illustrated in Tables 1 and 2 were prepared. For each resin composition, a number average molecular weight (Mn), a weight average molecular weight (Mw), a molecular weight distribution (Mw/Mn), a melting point (° C.), and a fusion heat quantity (J/g) were evaluated. The number average molecular weight, the weight average molecular weight and the molecular weight distribution were measured by gel permeation chromatography. The melting point and the fusion heat quantity were measured by differential scanning calorimetry (DSC).

The components described in "blending components" in Table 1 are as follows:

(A) base resin
- LDPE (low density polyethylene): density of 0.915 g/mL
- LLDPE (linear low density polyethylene): density of 0.920 g/mL (B) hindered phenol-based antioxidant
- Irganox® 1076 (manufactured by BASF, refer to the above-described formula (3))
- Adekastab AO-80 (manufactured by ADEKA, 3,9-bis{2-[3-(3-tert-butyl-4-hydroxy-5-methylphenyl)propionyloxy]-1,1-dimethylethyl}-2,4,8,10-tetraoxaspiro[5,5]undecane).

(Evaluation of Twinax Cable)

Together with the above-described resin compositions for forming the insulating layers, a pair of linear conductors each having a circular cross-sectional shape were prepared. Extrusion molding was performed to cover an outer circumferential surface of each conductor with each resin composition for forming the insulating layers, to thereby obtain two electric wires. Then, a conductor serving as a drain wire was disposed along the obtained two electric wires, and a shield tape (copper-deposited PET tape) was wound around these, and the outer circumferential side thereof was further covered with a protective coating. Thus, a twinax cable for evaluation having a structure similar to that of twinax cable 100 illustrated in FIG. 1 was obtained. The specifications of the twinax cable for evaluation are illustrated in the section "specifications of cable" in Tables 1 and 2.

(Measurement of Dielectric Tangent)

A sheet-like sample obtained by press-molding of the above-described resin composition for forming the insulating layers was made. The conditions for press-molding were such that the resin composition was preheated at 150° C. for 3 minutes, and then, pressure was applied at 150° C. and this state was maintained for 5 minutes. A dielectric tangent of the obtained sheet-like sample at the time of application of a high-frequency electric field having a frequency of 10 GHz was measured in accordance with a method based on JIS R1641 (2007). The result is illustrated in Tables 1 and 2.

(Evaluation of Transmission Loss and Skew)

In order to verify the transmission loss, a conductor diameter of conductors 10*a* and 10*b* and a thickness of insulating layers 20*a* and 20*b* were set such that a differential mode impedance was 100Ω in the differential signal transmission cable illustrated in FIG. 1, and the properties thereof were evaluated. A height dimension H of twinax cable 100 was 1.60 mm and a width dimension W was 3.20 mm. A network analyzer was used for evaluation of the transmission loss, and a time domain reflectometry (TDR) measuring instrument using a pulse signal having the rise time of 35 ps was used for evaluation of the skew.

(Measurement of Oxidation Induction Time)

The oxidation induction time was evaluated based on an exothermic peak at the time of heating to a certain temperature under the oxygen atmosphere. Specifically, using a differential scanning calorimeter (DSC-50 manufactured by Shimadzu Corporation), about 3 mg of the sample was put into an aluminum container (φ5 mm) to make the sample covered with an aluminum lid, and the sample was set in the above-described differential scanning calorimeter. The temperature of the sample was raised (20° C./min) under the nitrogen atmosphere, and when the temperature reached a measurement temperature, the sample was left for 5 minutes. Then, the atmosphere was switched to the oxygen atmosphere, and the time until an exothermic reaction occurred under the oxygen atmosphere was measured as the oxidation induction time (min). The oxidation induction time was evaluated under the two conditions of 200° C. and 220° C. The result is illustrated in Tables 1 and 2.

The contents and evaluation results of each Experimental Example are illustrated in Tables 1 and 2.

TABLE 1

| | | | | Experiment No. | | | | |
|---|---|---|---|---|---|---|---|---|
| | | | Unit | 1 | 2 | 3 | 4 | 5 |
| Blending components | base resin | | | LDPE | LDPE | LDPE | LDPE | LLDPE |
| | Irganox 1076 | | ppm | 40 | 200 | 3800 | | 200 |
| | Adekastab AO-80 | | ppm | | | | 200 | |
| Properties of resin composition | Mw/Mn | | | 6.9 | 6.9 | 6.9 | 6.9 | 5.3 |
| | Mn ($\times 10^4$) | | | 1.6 | 1.6 | 1.6 | 1.6 | 1 |
| | Mw ($\times 10^5$) | | | 11 | 11 | 11 | 11 | 5.3 |
| | melting point | | ° C. | 110 | 110 | 110 | 110 | 120 |
| | fusion heat quantity | | J/g | 129 | 129 | 129 | 129 | 160 |
| Specifications of cable | outer diameter of insulating electric wire* | | mmφ | 1.6 | 1.6 | 1.6 | 1.6 | 1.6 |
| | outer diameter of center conductors | | mmφ | 0.45 | 0.45 | 0.45 | 0.45 | 0.45 |
| Dielectric tangent (tanδ) | | 10 GHz | $\times 10^{-4}$ | 1.5 | 1.6 | 2.8 | 1.7 | 1.7 |
| Transmission loss | | 10 GHz | dB/m | −2.8 | −3.0 | −3.9 | −3.1 | −3.6 |
| Skew | | ps/m | | 3.2 | 3.9 | 5.8 | 4.1 | 7.2 |
| Oxidation induction time | | 200° C. | min | 5.2 | 6.1 | 14.1 | 15 | 9.6 |
| | | 220° C. | | 1.2 | 1.8 | 3.5 | 5.2 | 2.4 |

TABLE 2

| | | | | Experiment No. | |
|---|---|---|---|---|---|
| | | | Unit | 6 | 7 |
| Blending components | base resin | | | LDPE | LDPE |
| | Irganox 1076 | | ppm | 20 | 4200 |
| | Adekastab AO-80 | | ppm | | |
| Properties of resin composition | Mw/Mn | | | 6.9 | 6.9 |
| | Mn ($\times 10^4$) | | | 1.6 | 1.6 |
| | Mw ($\times 10^5$) | | | 11 | 11 |
| | melting point | | ° C. | 110 | 110 |
| | fusion heat quantity | | J/g | 129 | 129 |
| Specifications of cable | outer diameter of insulating electric wire* | | mmφ | 1.6 | 1.6 |
| | outer diameter of center conductors | | mmφ | 0.45 | 0.45 |
| Dielectric tangent (tanδ) | | 10 GHz | $\times 10^{-4}$ | 1.4 | 3.1 |
| Transmission loss | | 10 GHz | dB/m | −2.8 | −4.2 |
| Skew | | ps/m | | 3.4 | 6.2 |
| Oxidation induction time | | 200° C. | min | 3.5 | 15.4 |
| | | 220° C. | | 0.4 | 4.6 |

*outer diameter of the single insulating electric wire (signal wire) formed of the conductors and the insulating layers As can be seen from the results illustrated in Tables 1 and 2, in the twinax cables for evaluation in Experimental Examples of Experiment Nos. 1 to 4, each of which was provided with the insulating layers including the polyolefin resin and not less than 30 ppm and not more than 4000 ppm of the hindered phenol-based antioxidant, the dielectric tangent (tan δ) of the insulating layers at the time of application of a high-frequency electric field having a frequency of 10 GHz was $1.5\times10^{-4}$, $1.6\times10^{-4}$, $2.8\times10^{-4}$, $1.7\times10^{-4}$, and $1.7\times10^{-4}$, respectively, all of which were not more than $3.0\times10^{-4}$. All of the transmission losses of these twinax cables for evaluation showed the sufficiently low values when measured.

Furthermore, according to the evaluation results illustrated in Table 1, it is also clear that the twinax cable having a skew of not more than 6 ps/m is obtained by using the polyolefin resin having molecular weight distribution Mw/Mn of not less than 6.0. A comparison is made between Experimental Examples of Experiment Nos. 1 to 4 in which the polyolefin resin having molecular weight distribution Mw/Mn of not less than 6.0 is used and Experimental Example of Experiment No. 5 in which the polyolefin resin having molecular weight distribution Mw/Mn of less than 6.0 is used. Then, the skew is not more than 6 ps/m in all of Experimental Examples of Experiment Nos. 1 to 4, whereas the skew is as high as 7.2 ps/m in Experimental Example of Experiment No. 5. As described above, it is preferable to select the polyolefin resin having molecular weight distribution Mw/Mn of not less than 6.0 as the polyolefin resin forming the insulating layers.

On the other hand, it can be seen that in the twinax cable for evaluation in Experimental Example of Experiment No. 6 (comparative example) in which the content of the hindered phenol-based antioxidant is 20 ppm that is outside the range of not less than 30 ppm and not more than 4000 ppm, the oxidation induction time is very short. Therefore, it can be seen that Experimental Example of Experiment No. 6 in which the content of the hindered phenol-based antioxidant in the insulating layers is not more than 30 ppm is inferior in degree of progress of oxidation deterioration to Experimental Examples of Experiment Nos. 1 to 5 (examples).

It can also be seen that in the twinax cable for evaluation in Experimental Example of Experiment No. 7 (comparative example) in which the content of the hindered phenol-based antioxidant is higher than 4000 ppm, the dielectric tangent and the transmission loss are great. Furthermore, the skew is also as high as 6.2 ps/m. As described above, it is clear that when the content of the hindered phenol-based antioxidant is higher than 4000 ppm, the transmission property of the twinax cable is insufficient.

As described above, according to the twinax cable and the multi-core cable of the present disclosure, there can be provided a twinax cable and a multi-core cable in which a signal transmission loss can be sufficiently reduced.

It should be understood that the embodiments and examples disclosed herein are illustrative and non-restrictive in any respect. The scope of the present invention is defined by the terms of the claims, rather than the description above, and is intended to include any modifications within the scope and meaning equivalent to the terms of the claims.

REFERENCE SIGNS LIST

10*a* first conductor; 10*b* second conductor; 11*a* first conductor; 11*b* second conductor; 20*a* first insulating layer; 20*b* second insulating layer; 21 insulating layer; 30 shield tape; 31 shield tape; 40*a* first electric wire; 40*b* second electric wire; 50 sheath; 60 third conductor; 70 signal wire pair; 71 signal wire pair; 100 twinax cable; 101 twinax cable; 102 sub-unit; 110 twinax structure; 111 twinax structure; 200 multi-core cable.

The invention claimed is:

1. A twinax cable comprising a twinax structure, the twinax structure including:

a signal wire pair, the signal wire pair including a pair of signal wires formed of a first signal wire and a second signal wire, and an insulating layer configured to cover the pair of signal wires;

a drain wire; and a shield tape arranged to cover the signal wire pair and the drain wire, the insulating layer being mainly composed of a polyolefin resin, the insulating layer including not less than 30 ppm and not more than 4000 ppm of a hindered phenol-based antioxidant, a dielectric tangent tan δ of the insulating layer at the time of application of a high-frequency electric field having a frequency of 10 GHz being not more than $3.0\times10^{-4}$, wherein the hindered phenol-based antioxidant is an antioxidant having a chemical structure represented by the following formula:

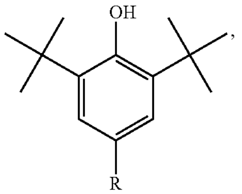

wherein R represents a monovalent organic group.

2. The twinax cable according to claim 1, wherein a skew is not more than 6 ps/m.

3. The twinax cable according to claim 1, wherein a molecular weight distribution Mw/Mn of the polyolefin resin is not less than 6.0.

4. The twinax cable according to claim 1, wherein the polyolefin resin is any one of low density polyethylene, linear low density polyethylene, medium density polyethylene, and high density polyethylene.

5. The twinax cable according to claim 1, wherein the polyolefin resin is electron-beam-crosslinked.

6. The twinax cable according to claim 1, wherein a cross section perpendicular to a longitudinal direction is symmetric with respect to a perpendicular bisector line of a line segment connecting a center of gravity C1 of the first signal wire and a center of gravity C2 of the second signal wire.

7. A multi-core cable comprising:

at least one twinax cable as recited in claim 1; and a hollow cylindrical sheath arranged to contain the twinax cable.

* * * * *